United States Patent
Arnold et al.

(10) Patent No.: US 8,536,031 B2
(45) Date of Patent: Sep. 17, 2013

(54) METHOD OF FABRICATING DUAL DAMASCENE STRUCTURES USING A MULTILEVEL MULTIPLE EXPOSURE PATTERNING SCHEME

(75) Inventors: John C. Arnold, North Chatham, NY (US); Kuang-Jung Chen, Poughkeepsie, NY (US); Matthew E. Colburn, Schenectady, NY (US); Dario L. Goldfarb, Dobbs Ferry, NY (US); Stefan Harrer, New York, NY (US); Steven J. Holmes, Guilderland, NY (US); Pushkara Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 12/708,877

(22) Filed: Feb. 19, 2010

(65) Prior Publication Data

US 2011/0204523 A1 Aug. 25, 2011

(51) Int. Cl.
*H01L 21/26* (2006.01)
*H01L 21/42* (2006.01)

(52) U.S. Cl.
USPC ........... 438/513; 438/514; 438/700; 438/712; 257/E21.006; 257/E21.007; 257/E21.027; 257/E21.029; 257/E21.043; 257/E21.058; 257/E21.077; 257/E21.17; 257/E21.218; 257/E21.248; 257/E21.267; 257/E21.278

(58) Field of Classification Search
USPC ................. 438/513, 514, 700, 712, 680, 723, 438/743, 780; 257/396, 649, 759, E21.006, 257/E21.007, E21.027, E21.029, E21.043, 257/E21.058, E21.077, E21.17, E21.218, 257/E21.248, E21.267, E21.278
See application file for complete search history.

(56) References Cited

U.S. PATENT DOCUMENTS

| | | | |
|---|---|---|---|
| 5,288,660 A | 2/1994 | Hua et al. | |
| 5,877,076 A | 3/1999 | Dai | |
| 5,906,910 A | 5/1999 | Nguyen et al. | |
| 6,355,399 B1 | 3/2002 | Sajan et al. | |
| 6,436,810 B1 | 8/2002 | Kumar et al. | |
| 6,589,711 B1 | 7/2003 | Subramaniam et al. | |
| 6,737,222 B2 | 5/2004 | Subramaniam et al. | |
| 7,078,348 B1 | 7/2006 | Singh et al. | |
| 7,364,836 B2 | 4/2008 | Liu et al. | |
| 7,432,191 B1 | 10/2008 | Stamper et al. | |
| 7,517,634 B2 | 4/2009 | Benoit et al. | |
| 7,563,719 B2 | 7/2009 | Chen et al. | |
| 7,579,137 B2 * | 8/2009 | Colburn et al. | 430/313 |
| 7,727,708 B2 * | 6/2010 | Colburn et al. | 430/311 |
| 2006/0197228 A1 | 9/2006 | Daubenspeck et al. | |
| 2007/0148598 A1 | 6/2007 | Colburn et al. | |
| 2007/0166648 A1 | 7/2007 | Ponoth et al. | |
| 2007/0178410 A1 | 8/2007 | Shih et al. | |
| 2009/0104566 A1 | 4/2009 | Burkhardt et al. | |
| 2009/0208867 A1 | 8/2009 | Harada et al. | |
| 2009/0208873 A1 | 8/2009 | Harada et al. | |

* cited by examiner

*Primary Examiner* — David Nhu (74) *Attorney, Agent, or Firm* — Daniel P. Morris (57) ABSTRACT

A method for fabricating a dual damascene structure includes providing a first photoresist layer coated on an underlying dielectric stack, exposing said first photoresist layer to a first predetermined pattern of light, coating a second photoresist layer onto the pre-exposed first photoresist layer, exposing said second photoresist layer to a second predetermined pattern of light, optionally post-exposure baking the multi-tiered photoresist layers and developing said photoresist layers to form a multi-tiered dual damascene structure in the photoresist layers.

11 Claims, 8 Drawing Sheets

METHOD OF FABRICATING DUAL DAMASCENE STRUCTURES USING A MULTILEVEL MULTIPLE EXPOSURE PATTERNING SCHEME

TECHNICAL FIELD

This present invention relates generally to the fabrication of very-large scale integrated (VLSI) or ultra-large scale integrated (ULSI) circuits, and more particularly, to the fabrication of a dual damascene structure using a multilayer photoresist stack in conjunction with a multi level exposure.

BACKGROUND

The fabrication of Very-Large Scale Integrated (VLSI) or Ultra-Large Scale Integrated circuit (ULSI) involves the use of metallic wiring that connects individual devices in a semiconductor chip to one another. The wiring interconnect network of the circuit includes two features: line features that traverse a distance across the chip, and via features which connect lines in different layers together. Historically, both layers are made from a dielectric material such as an inorganic glass like silicon dioxide ($SiO_2$) or a fluorinated silica film deposited by plasma enhanced chemical vapor deposition (PECVD). This dielectric material insulates the conductive patterns that compose the metallic via and line structures, typically made of copper, tungsten, silver, gold or aluminum.

Figure 1A:
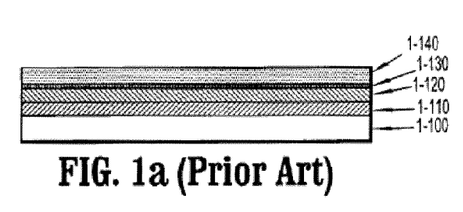
FIGS. 1A-1G depicts a conventional dual damascene fabrication process based on a single-layer imaging and a single-layer pattern transfer process.

One method described in U.S. Pat. No. 7,579,137 of creating a wiring network on such small scale is known as the dual damascene (DD) process, shown schematically in FIGS. 1a-1g. In a standard DD process, an interlayer dielectric (ILD), shown as two layers, a via level dielectric 1-110 and a line level dielectric 1-120, are formed on a substrate 1-100, as shown in FIG. 1a. The two layers 1-110, 1-120 are shown separately for clarity of the process flow description. These two layers can be made from the same or from different insulating films, and in the former case can be applied as a single monolithic layer. A hard mask layer 1-130 is optionally employed to facilitate etch selectivity and can serve as a polish stop, as is well known in the art.

Figure 1B:
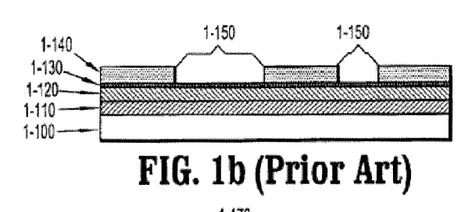
Figure 1C:
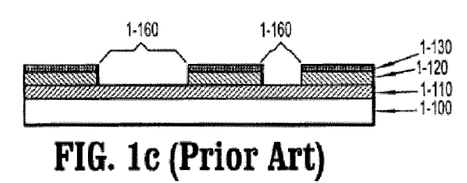
Figure 1D:
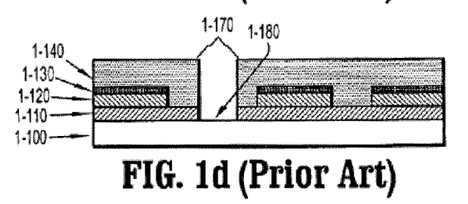

In the dual damascene process, the position of lines 1-150 and vias 1-170 can be defined lithographically in photoresist layers, 1-140, as shown in FIGS. 1b and 1d, and transferred into hard mask 1-130 and ILD layers 1-110, 1-120 using reactive ion etching processes. The process sequence shown in FIGS. 1a-1g is known as a "line-first" to approach because trenches 1-160 which house the line feature are etched first, as shown in FIG. 1c. Referring to FIG. 1d, after the trench formation, lithography is used to define a via pattern 1-170 in the photoresist layer 1-140 which is formed in the dielectric layers 1-110, 1-120 to generate a dielectric via opening 1-180.

Figures 1E, 1F, 1G:
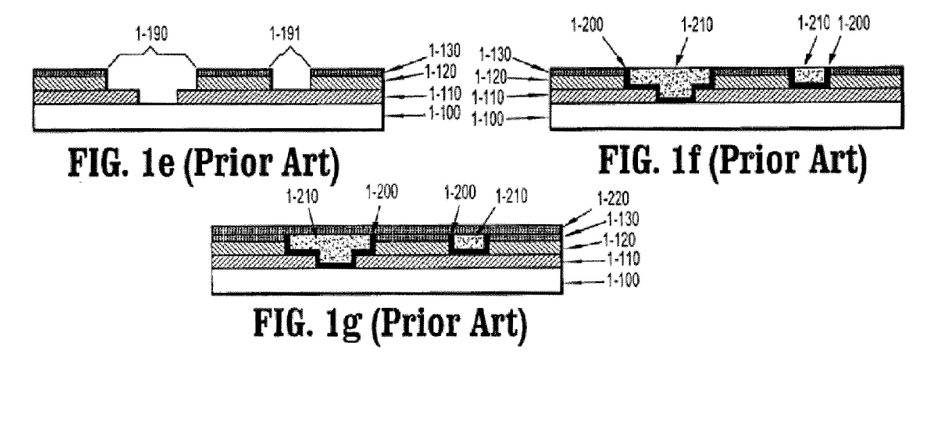

A dual damascene via structure 1-190 and trench structure 191 is shown in FIG. 1e after the photoresist layer 1-140 has been stripped. The structures 1-190, 1-191 are coated with a conducting liner material or material stack 1-200 that will protect conductor metal lines and vias and serve as an adhesion layer between the conductor and the ILD (1-110, 1-120). The recesses are then filled with a conducting fill material 1-210 over the surface of the patterned substrate. The fill 1-210 can be accomplished by electroplating copper, although other methods such as chemical vapor deposition (CVD) and other materials such as Al or Au can also be used. The fill 1-210 and liner materials 1-200 are then chemically-mechanically polished (CMP) to be coplanar with the surface of the hard mask 1-130, as shown in FIG. 1f.

A capping material or blanket film 1-220 is deposited over the metal 1-210, as is depicted in FIG. 1g, to passivate the exposed metal surface 1-210 and to serve as a diffusion barrier between the metal 1-210 and any additional ILD layers to be deposited over the film 1-220. Silicon nitride, silicon carbide, and silicon carbonitride films deposited by PECVD are typically used as the capping material 1-220. This process sequence is repeated for each level of interconnects on the device. Since two interconnect features are defined to form a conductor in-lay within an insulator by a single polish step, the process of FIGS. 1a-1g is designated a dual damascene process.

The above manufacturing methods for dual damascene structures typically to involve a minimum of two lithography exposures alternated with two reactive ion etch steps, as well as the deposition steps such as those shown in FIGS. 1a-1g. Typically two lithography steps are required. For each lithography step, there may be several reactive ion etch steps required to open any auxiliary layers such as antireflective coatings and hardmask stacks, as well as the dielectric material itself. In the is aforementioned BEOL lithography-etch-lithography-etch (LELE) process flow, inter-tool wafer exchange sequences for the processing of such layers directly impacts wafer throughput and adds to the cost of high-volume semiconductor nanofabrication. Therefore, there is a need to provide a method of forming a three dimensional lithographic pattern which can simplify the process flow, reduce production cost and increase throughput.

SUMMARY OF INVENTION

A broad aspect of the present invention is a simplified method and structure formed thereby to make BEOL dual damascene structures with fewer processing steps and different lithographic patterning schemes.

One aspect of the present invention is to provide a method, and structures fabricated thereby, of forming a multi-tiered structure, which implements multiple one-level reticles and a two-level photoresist stack, and a more particular aspect are methods, and structures fabricated thereby, for fabricating a dual damascene structures using multiple one-level reticles and a two-level photoresist stack. In comparison with conventional dual damascene patterning schemes the present invention simplifies the process flow resulting in reduced manufacturing costs and increase in throughput.

According to another aspect of the invention, there is provided a method, and a structure fabricated thereby, for fabricating a three-dimensional structure such as a dual damascene pattern. The method comprises providing a first photoresist layer having a distinct first dose-to-clear value and exposing said first photoresist layer to a first predetermined pattern of light with a first exposure removal dose to create a first developable region. At this stage, post-exposure bake and development of the exposed first photoresist layer is postponed until a later step. A second photoresist layer having a distinct second dose-to-clear value is subsequently provided. The second dose-to-clear value of the second photoresist layer is lower than the first dose-to-clear value of the first photoresist layer. The two-level photoresist stack thus formed is exposed to a second predetermined pattern of light with a second exposure removal dose. The second exposure removal dose is smaller than the first exposure removal dose. Exposure of the two-level photoresist stack to the second predetermined pattern of light creates a second developable region in the second photoresist layer. Then, the first photoresist layer and the second photoresist layer are post-exposure baked and developed to remove the first developable region in the first photoresist layer and the second developable region in the second photoresist layer, to form a multi-tiered structure in the photo-resist layers. The imaging formation process utilizes a coat-expose-coat-expose-PEB-develop sequence.

In a further aspect of the invention, the method further comprises transferring the multi-tiered structure into an interlayer dielectric layer of the semiconductor substrate.

In a further aspect of the invention, the method further comprises incorporating an additional stack comprising at least two material layers between the multi-tiered photoresist structure and the dielectric layer of the semiconductor substrate.

In a further aspect of the invention, the additional stack between the multi-tiered photoresist structure and the dielectric layer of the semiconductor substrate comprises at least one organic layer that can be etched using a RIE-based organic etch technique. RIE is an acronym for reactive ion etch.

In a further aspect of the invention, the additional stack between the multi-tiered photoresist structure and the dielectric layer of the semiconductor substrate comprises at least one silicon containing layer that can be etched using a RIE-based dielectric etch technique.

In a further aspect of the invention, the additional stack between the multi-tiered photoresist structure and the dielectric layer of the semiconductor substrate facilitates the transfer of the multi-tiered photoresist structure into the dielectric layer of the semiconductor substrate.

In a further aspect of the invention, the additional stack between the multi-tiered photoresist structure and the dielectric layer of the semiconductor substrate comprises at least two neighboring material layers that can be etched selectively to each other.

In a further aspect of the invention, the additional stack between the multi-tiered photoresist structure and the dielectric layer of the semiconductor substrate contains at least one layer that acts as an hard etch mask.

In a further aspect of the invention, the additional stack between the multi-tiered photoresist structure and the dielectric layer of the semiconductor substrate contains at least one layer that acts as an organic planarizing layer (OPL).

DETAILED DESCRIPTION

Method A

A first method for fabricating a dual damascene structure includes providing a multi-layer photoresist stack comprising a bottom photoresist layer and a top photoresist layer. The top photoresist layer has enhanced photosensitivity to radiation compared to the bottom photoresist layer. Alternatively, the bottom photoresist layer is sensitive to a first wavelength of light, whereas the top photoresist layer is sensitive to a second wavelength of light. The said photoresist layer stack is exposed to one or more predetermined patterns of light, followed by a post-exposure bake (PEB) step and developed to form a multi-tiered structure in the photo-resist layers. A general process flow for this particular method can be described as a coat-coat-expose-expose-PEB-develop sequence.

U.S. Pat. No. 5,288,660, the teaching of which is incorporated herein by reference, describes the use of a two-layer photoresist stack for the fabrication of T-shaped transistor electrodes. The top and bottom photoresist layers have sensitivity to different ultraviolet radiation wavelengths respectively.

Patent Applications US27148598A1 and US27178410A1, the teaching of both of which are incorporated herein by reference, describe the use of a two-layer photoresist stack wherein the top photoresist layer has enhanced radiation sensitivity to a selected radiation wavelength with respect to the bottom photoresist layer. Via-level and trench-level exposure doses are independently registered in the dual-layer imaging stack either by use of separate via-level and trench-level reticles or by use of a single grey tone mask containing both exposure levels. The multilayered photoresist stack is then developed to form a three-dimensional dual damascene photoresist structure.

Figure 2A:
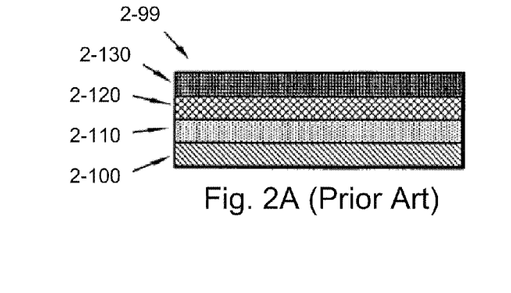
FIG. 2A-2E depict a dual damascene fabrication process based on a coat-coat-expose-expose-PEB-develop patterning process (prior art, method A)

FIGS. 2A-2E are schematic diagrams that depict a photolithography process according to U.S. Pat. No. 7,579,137 described above. Referring now to FIG. 2A, a semiconductor device 2-99 is shown that includes a substrate 2-100 coated with an interlayer dielectric (ILD) 2-110 and a photoresist stack comprising a top photoresist 2-120 with high sensitivity to a predetermined wavelength of light, and a bottom photoresist 2-130 with low photosensitivity to a identical wavelength of light.

Figure 2B:
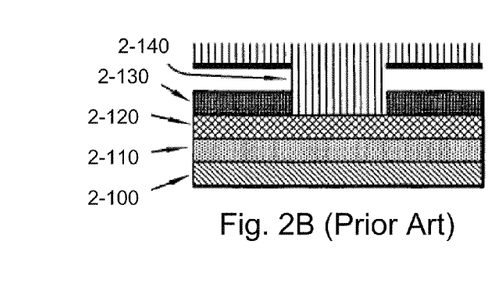
Figure 2C:
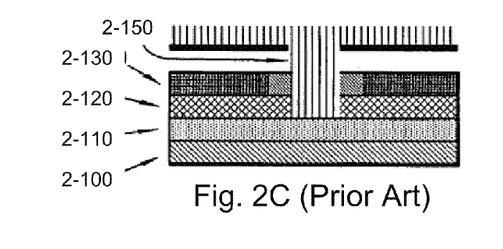
Figure 2D:
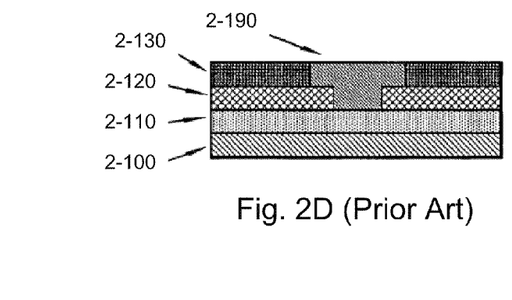
Figure 2E:
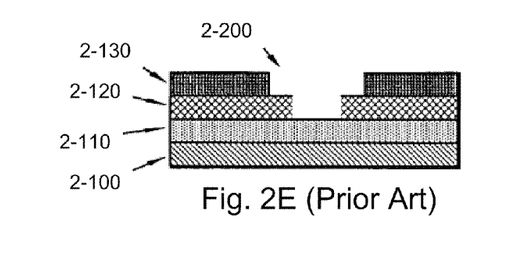

Referring now to FIG. 2B, the device 2-99 is exposed to a projected image 2-140 using a low dose of radiation at a predetermined wavelength of light. The light is projected into the top photoresist 2-130 but the delivered dose is not sufficient to create said image in the bottom photoresist 2-130.

Figure 4A:
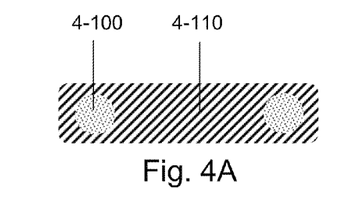
FIGS. 4A-4J are schematic diagrams, top-down SEM images and modeling results that illustrate the challenges presented by a dual damascene fabrication process based on prior art method A.
Figures 4B, 4D, 4E:
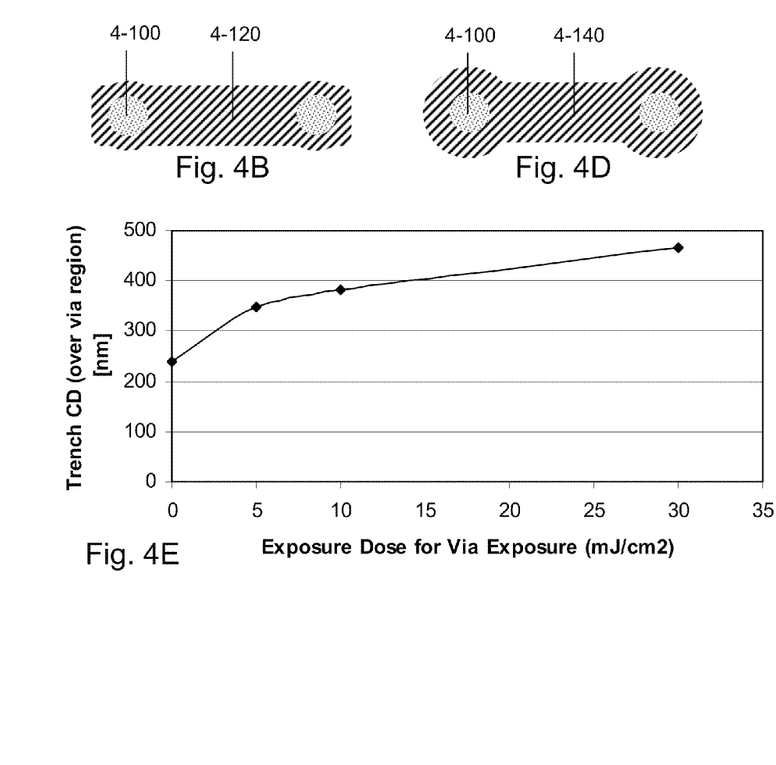
Figure 4C:
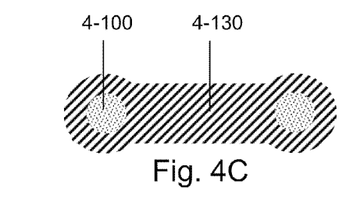

Referring now to FIG. 4C a second projected light pattern 4-150 using a high dose of radiation at a predetermined wavelength of light can penetrate through the exposed section of the top photoresist 2-130 and into the bottom photoresist 2-120 causing a similar latent image in the first photoresist 2-120.

After a short post exposure bake is performed, the latent image of the projected light results in a chemical reaction rendering a region 4-190 within the layers 2-120, 2-130 soluble in a developer, as indicated in FIG. 4D. The two photoresist layers 2-120, 2-130 are then developed in a conventional developer in a single step to form a dual damascene pattern 2-200 in the resist as shown in FIG. 4E.

The resulting pattern 2-200 is then transferred using known methods into the underlying interlayer dielectric 2-110 or other material for other applications requiring multilevel structures.

Methods A described above represent a simplified process flow for the fabrication of dual damascene structures, having the advantage that the via etch, the trench etch and the photoresist ashing are performed as a continuous process in one etch chamber. Nevertheless, proposed Methods A and B contain intrinsic design and processing challenges that have not been explicitly described or addressed by the prior art. In order to provide more specific background information to support the present invention, critical evaluation of the aforementioned prior art is herein included.

Method A—Challenges

Method A utilizes a process flow consisting on a coat-coat-expose-expose-develop sequence. Since both the via-level exposure and the trench-level exposure traverse the dual-layer imaging stack, it is unequivocal that the high-sensitivity top resist 2-130 in FIG. 2 receives a large imaging dose from the via-level exposure, in addition to the dose-to-size imaging dose from the trench-level exposure. This former dose contributes to a trench-level CD bias that manifests as trench pattern fidelity loss around the areas where the vias are printed.

FIGS. 4A-J show the effect of via-level exposure dose on the trench-level CD bias for variable exposure dose levels. FIG. 4A shows the idealized via-level (4-100) and trench-level (4-110) developable areas after sequential exposure of the patterning levels, for a dual damascene geometry layout. In practice, a deviation from the idealized case occurs when the via-level exposure dose incrementally departs from trench level exposure dose. FIGS. 4B-D, show independent cases where the photosensitivity of the via-level photoresist is progressively reduced. In FIG. 4B, the via-level developable area 4-100 located at the edges of trench-level developable area 4-120 causes the trench-level developable area to slightly deviate from the idealized shape 4-110 due to the added via-level exposure dose received by the trench photoresist. As the photosensitivity of the via-level photoresist continues to be reduced, the edges of the trench-level developable area become lobule-shaped as indicated by regions 4-130 and 4-140 in FIG. 4C and FIG. 4D respectively.

Simulation of such via-trench dose interaction was performed utilizing a Prolith modeling engine (KLA-Tencor) with adjusted photoresist and exposure parameters that mimic the exposure conditions outlined in the previous paragraph. A 248 nm trench exposure (annular illumination, NA=0.65, sigma=0.6/0.3) with nominal trench photoresist dose-to-size equal to 3.0 mJ/cm2 was used to define a trench developable area with CD=240 nm (pitch=480 nm). A 248 nm via exposure (conventional illumination, NA=0.65, sigma=0.6) with variable via photoresist dose-to-size was added to the previous exposure. Nominal via photoresist dose-to-size equaled 30 mJ/cm2 which defined a via developable area with CD=270 nm (pitch=540 nm). The results of the modeled exposure are shown in FIG. 4E. The trench CD over the via region incrementally departs from the nominal value as the via exposure raise increases towards the dose-to-size value.

Figure 4F:
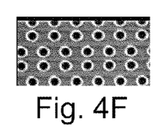
Figure 4G:
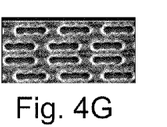
Figure 4H:
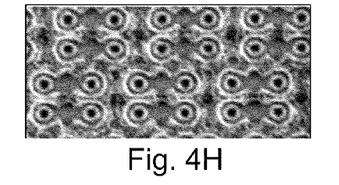
Figure 4I:
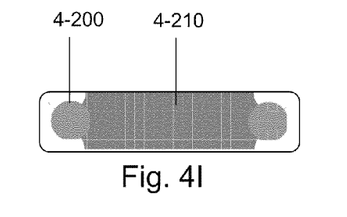

Qualitative verification of the above results was performed using a 193 nm exposure system (annular illumination, NA=0.75, sigma=0.x/0.y). A photomask set consisting of M2 and V1 patterns capable of printing trenches with CD=170 nm and vias with CD=144 nm respectively was used to print a top and bottom resist layers. The top and bottom resist layers had dose-to-size photosensitivities equal to 8.0 mJ/cm2 and 25 mJ/cm2 respectively, under the exposure conditions defined above. Single-exposure patterning of the individual top and bottom photoresist layers using either M2 or V1 photomask levels is shown in FIGS. 4F-G. Additive exposures comprising M2 and V1 levels on the dual layer photoresist stack is shown in FIG. 4H. The via level is neatly defined in the bottom resist layer and largely unaffected by the low-dose trench exposure. Conversely, the trench features in the top resist layer are largely distorted as a result of the high dose delivered with the via expose.

Figure 4J:
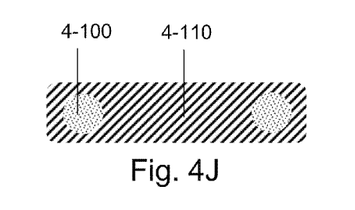
Figure 5A:
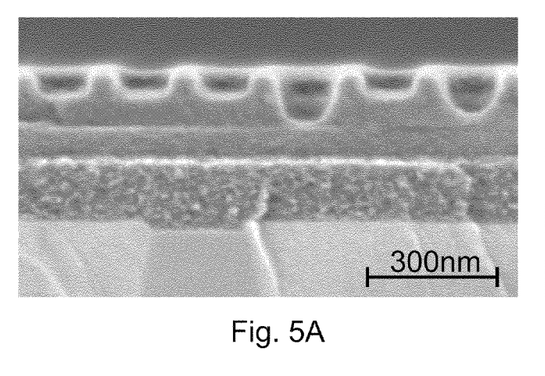
FIGS. 5A-5B are top-down SEM images that illustrate the challenges presented by a dual damascene fabrication process based on prior art method B.
Figure 5B:
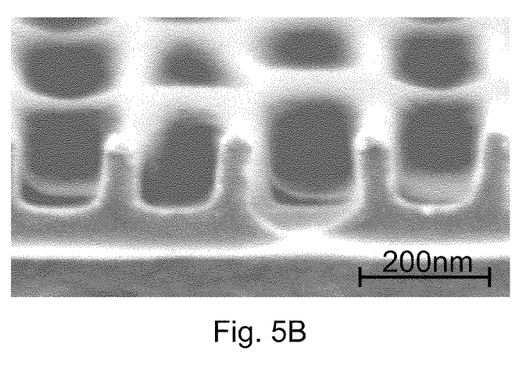

Dedicated pattern layout design can potentially be used to compensate for the trench CD bias introduced by the via exposure, however such correction for optical proximity would inevitably add complexity to the mask data preparation process. A rudimentary optical proximity correction (OPC) for the trench geometry used in a dual damascene structure is proposed in FIG. 4I. Area 4-200 corresponds to via-level exposed regions, while region 4-210 corresponds to trench level exposed areas. The shape of region 4-210 has been adjusted so that the total dose delivered around the ends of the trench is leveled with the dose delivered near the center of the trench, so that CD uniformity along the edge of the entire feature is preserved. Such spatial dose distribution resulting from introducing dedicated OPC can generate trench developable areas that are very close to the intended shapes originally designed (FIG. 4J, areas 4-100, 4-110).

This conclusive experimental evidence indicates that Method A cannot provide an easily realizable patterning solution to the dual damascene fabrication process Method B A second method for fabricating a dual damascene structure including providing a bottom photoresist layer, exposing the bottom photoresist layer to a first predetermined pattern of light, post-exposure baking the bottom photoresist layer, developing the bottom photoresist layer, providing a top photoresist layer onto the first patterned bottom photoresist layer, exposing the top photoresist layer to a second predetermined pattern of light, post-exposure baking the top photoresist layer and developing the top photoresist layer to form a multitiered structure in the photoresist layers. A general process flow for this particular method can be described as a coat-expose-PEB-develop-coat-expose-PEB-develop sequence.

U.S. Pat. No. 5,877,076 and U.S. Pat. No. 7,078,348, the teaching of both of which are incorporated herein by reference, describe the use of a bottom photoresist that is used to pattern and develop a dark field via-level layout, followed by a hard bake curing step to crosslink the patterned bottom resist structures. The hard bake curing process enables the subsequent coating of a top photoresist without disrupting the integrity of the bottom photoresist. The top photoresist is then imaged with a bright field trench-level layout and developed to create a dual damascene structure.

U.S. Pat. No. 7,364,836, the teaching of which is incorporated herein by reference, describes a similar process to the one outlined in the previous paragraph, with the first photoresist layer being sensitive to I-line (365 nm) radiation and the second photoresist layer being sensitive to DUV (248 nm) radiation. This patent has no specific description of the method used to enable coating of the second photoresist layer on top of the patterned first photoresist layer is indicated.

U.S. Pat. No. 7,432,191, the teaching of which is incorporated herein by reference, describes the use of a first photoresist layer on top of developable antireflective coating (dBARC). The first photoresist layer and the dBARC are imaged and developed to form the first image pattern. Thereafter, the first photoresist layer is removed and the dBARC is modified by thermal treatment. A second photoresist layer is then formed on top of the dBARC layer, and the second photoresist layer is then imaged and developed to form the second image pattern.

Patent application US27166648A1, the teaching of which is incorporated herein by reference, describes the use of a bottom negative-tone photoresist that is used to pattern and develop a bright field via-level layout. The exposed regions of the bottom negative-tone photoresist become insoluble in organic solvent during the post-exposure bake. A top negative tone photoresist is subsequently coated on top of the via-patterned bottom photoresist. The top photoresist is then imaged with a bright field trench-level layout and developed to create a dual damascene structure contained in the patterned photoresist layers.

Figure 3A:
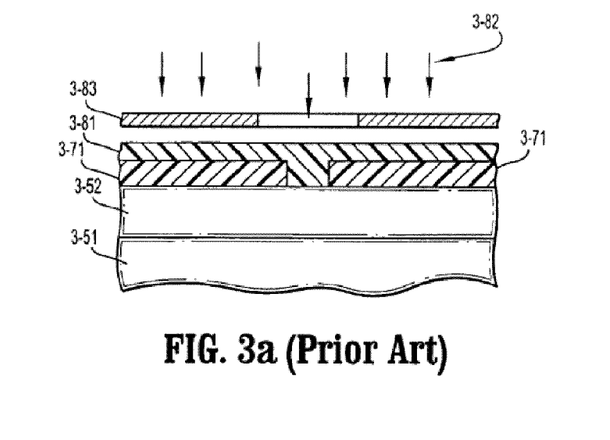
FIGS. 3A-3C depict a dual damascene fabrication process based on a coat-expose-PEB-develop-coat-expose-PEB-develop patterning process (prior art, method B).
Figure 3B:
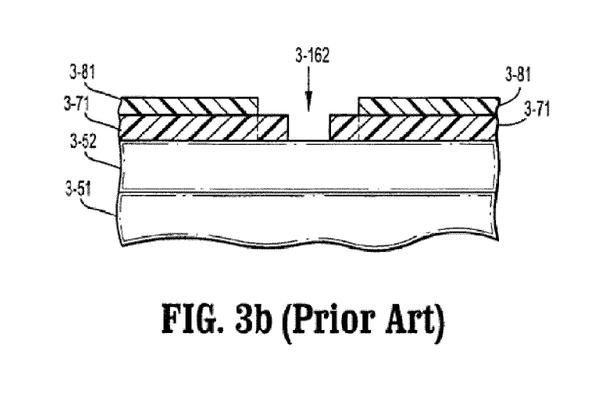
Figure 3C:
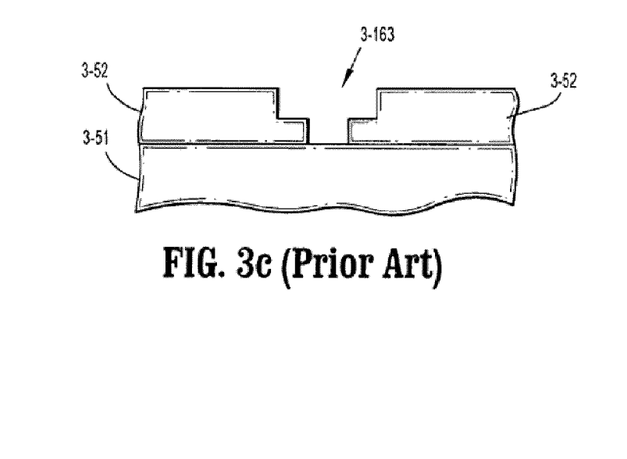

FIGS. 3A-3C are schematic diagrams that depict a photolithography process according to Method B described above from U.S. Pat. No. 643,810. As shown in FIG. 3A, a resist 3-81 is coated over a previously-developed resist 3-71, then exposed to light 3-82 through a mask 3-83. The resists 3-71, 3-81 are developed to form a multitiered structure 3-162 on a substrate 3-51 having a material to be patterned 3-52, as shown in FIG. 3B. In FIG. 3C, the multi-tiered structure 3-162 is transferred into the material 3-52 according to processes well known in the art to generate a final structure 3-163 that is commensurate with the original multitiered pattern 3-162. This process utilizes a coat-expose-PEB-develop-coat-expose-PEB-develop sequence.

Method B described above represent a simplified process flow for the fabrication of dual damascene structures, having the advantage that the via etch, the trench etch and the photoresist ashing are performed as a continuous process in one etch chamber. Nevertheless, proposed Methods A and B contain intrinsic design and processing challenges that have not been explicitly described or addressed by the prior art. In order to provide more specific background information to support the present invention, critical evaluation of the aforementioned prior art is herein included.

Method B—Challenges

This process utilizes a coat-expose-develop-coat-expose-develop sequence. With this method, the second photoresist layer is conformally coated on top of the patterned first photoresist layer. Exposure of the second photoresist layer is performed to generate photoresist developable areas that include the trench portion as well as the via-filled section of the dual damascene structure. One implicit condition for Method B to be successful is that enough dose should reach both the trench imaging layer as well as the via imaging layer. The increase in numerical aperture (NA) as a means to achieve higher resolution with 193 nm imaging wavelength unavoidably leads to reduced depth of focus. Focus process window as low as 100 nm is common for 1.35 NA immersion exposures, which is commensurate with typical 193 nm photoresist thickness. Therefore, it is expected that any imageable layer stack with total thickness larger than the total focus budget will print deficiently because either the top or bottom section of the imaging stack will remain out of focus under such exposure conditions.

In order to put the above hypothesis to the test, a first resist layer was coated with a thickness equal to 100 nm and exposed with a 193 nm scanner (0.85 NA, conventional illumination, sigma=0.75; via mask, dose=65 mJ/cm2, focus=−0.04 um). Inertness towards organic solvent attack from a second photoresist coating was induced in the first patterned resist layer through a hard-bake process. Vias patterned with the first resist layer (CD=115 nm) were conformally coated with a second resist layer (100 nm thick). The second resist layer was exposed with a 193 nm scanner (0.85 NA, annular illumination, sigma=0.8/0.5; metal level mask, dose=30 mJ/cm2, focus=−0.04 um) and develop to generate trench structures (CD=140 nm) over the previously patterned via structures. The dual damascene structures comprised by the via chain and the trench structures were cross-sectioned and imaged with a scanning electron microscope (SEM) in order to obtain a sliced view of their lateral profile. Cross sectional images shown in Figure X show that significant residue is left in the via chain patterns, despite the use of low NA (0.85 NA) imaging conditions and thin resist layers (100 nm) when Method B is used. This conclusive experimental evidence indicates that Method B cam not provide an easily realizable patterning solution for the dual damascene fabrication process.

Exemplary Embodiments

Exemplary embodiments of the invention as described herein generally include methods for producing a dual damascene using two one-level reticle and one two-level resist coating. While there are a multitude of embodiments possible, a subset is detailed here. In the interest of clarity, not all features of an actual implementation which are well known to those of skill in the art are described in detail herein.

According to an embodiment of the present invention, the differential solubility of lithographic photoresists in organic solvents is exploited. Conventional 193 nm photoresists used with dry and immersion ArF scanners are soluble in organic solvents such as glycol ethers and ketones. Examples of such solvents are propylene glycol methyl ether acetate (PGMEA), propylene glycol methyl ether (PGME) cyclohexanone and gamma-butyrolactone. However, conventional 193 nm photoresists are insoluble in linear or branched aliphatic alcohols such as 4-methyl-2-pentanol, 1-pentanol, 2-methyl-2-hexanol and 3-methyl-1-butanol and geometric isomers of comparable boiling point and vapor pressure. On the contrary, novel 193 nm photoresists with increased fluorine content, such as those described by Harada et al. in US Patent Applications US2009/0208867A1 and US2009/0208873A, the teaching of both of which are incorporated herein by reference, have augmented solubility in aliphatic alcohols due to the presence of more polarizable groups, such as hexafluoro-alcohol moieties, in higher concentration compared to conventional 193 nm photoresists. This differential solubility property between conventional 193 nm photoresists and 193 nm photoresists with high fluorine content allows for the coating of a dual 193 nm photoresist layer. This dual 193 nm photoresist layer consists of a bottom layer comprised of a conventional 193 nm photoresist and a top layer comprised of a 193 nm photoresist with high fluorine content. The conventional 193 nm photoresist material is formulated in a glycol ether, ketone or solvent combination thereof. The high-fluorine content 193 nm photoresist is formulated in an aliphatic alcohol. The top 193 nm photoresist layer can be coated on top of the unexposed or exposed bottom 193 nm photoresist layer without significant intermixing.

ArF scanners are lithography patterning tools that utilize 193 nm radiation to is define photoresist structures. ArF dry scanners utilize air between the last lens element and the silicon wafer, whereas ArF immersion scanners incorporate ultrapure water between the last lens element and the silicon wafer. Models of ArF scanners are Twinscan XT 1900Gi, 1700Fi, and 1450G manufactured by ASML, FPA-7000AS7 and FPA-7000AS5 manufactured by Canon as well as NSR-5305B and NSR-5306 manufactured by Nikon.

According to another embodiment of the present invention, the dose-to-clear values of different lithographic photoresists is exploited. The dose-to-clear value is a measure of the amount of exposure required for a photoresist to fully develop. A material with a distinct dose-to-clear response will typically have a sharp exposure-development curve, and will not form a latent image for an exposure less than the dose-to-clear value. The sensitivity of the resist can be modulated by one or more of the following: differences in photoacid concentration, differences in base loading, differences in polymer structure, differences in mechanism of dissolution, differences in amount or effectiveness of dissolution inhibitor, and in the case of negative tone resists, differences in cross-linker concentration.

Preferred dose-to-clear ratio between the bottom 193 nm photoresist and the top 193 nm photoresist ranges from 2.5 to 4.0. (Any value between 2.5 and 4.0 is included, including but not limited to in increments of 0.0001.) This preferred range guarantees optimum image contrast involved in the image formation process and results in higher to pattern quality compared to dose-to-clear ratio values between the bottom 193 nm photoresist and the top 193 nm photoresist that fall outside this range.

According to an embodiment of the invention, the optical properties of different lithographic photoresists are exploited. Typically, short-wavelength photoresists are transparent at both shorter and longer wavelengths, while long-wavelength photoresists tend to be absorbing at shorter wavelengths. For example, phenolic resins are relatively transparent at 248 nm but absorbing at 193 nm, but norbornene-based resist tend to be transparent at 248 nm and at 193 nm. Many materials useful as photoresist layers have tailorable absorbance peaks. An example is anthracene-like chromophore, which can have peak absorbance tailored to be less than 400 nm. Anthracene will absorb heavily in the 365 nm region and can also absorb at shorter wavelengths such as 193 nm. The top and bottom photoresist layers can therein be tailored to independently display sensitivity to ArF (193 nm), KrF (248 nm) or I-line (365 nm) imaging radiation. The top and bottom photoresist layers would therefore be exposed to a plurality of light patterns of wavelengths that correspond to the sensitivities of the individual photoresist layers.

A one-level reticle in accordance with an embodiment of the invention would be able to project an aerial image commensurate with the line-space and via patterns in a dual damascene structure. Such a one-level reticle would include one or more of optical proximity corrected patterns, assist features, and phase shift patterns, as are known in the art.

FIGS. 6A-6F are schematic diagrams that depict a photolithography process according to an exemplary embodiment of the invention. More specifically, the photolithographic process depicted in FIGS. 6A-6F utilizes two coatings, two exposures, and a single post-exposure bake and development sequence (coat-expose-coat-expose-PEB-develop), which reduces the processing relative to the photolithographic process shown in FIGS. 3A-3C (coat-expose-PEB-develop-coat-expose-PEB-develop) by two steps.

For the sake of clarity, FIGS. 6A-6F do not depict optional intermediate layers that can be used for compatibility issues such as intermixing and latent image profile enhancement.

Figure 6A:
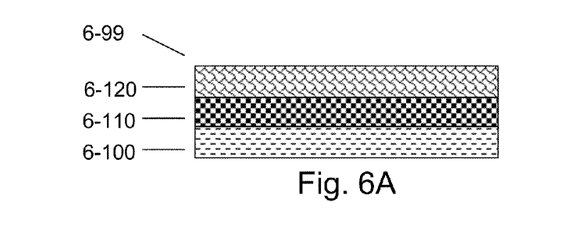
FIGS. 6A-6F are schematic diagrams that depict a dual damascene fabrication process based on an exemplary embodiment of the present invention consisting of a coat-expose-coat-expose-PEB-develop patterning process.

Referring now to FIG. 6A, a semiconductor device 6-99 is shown that includes a substrate 6-100 coated with an interlayer dielectric (ILD) 6-110 and a first photoresist layer 6-120 having a first dose-to-clear value. In one embodiment of the invention, the first photoresist 6-120 is a 193 nm resist.

Figure 6B:
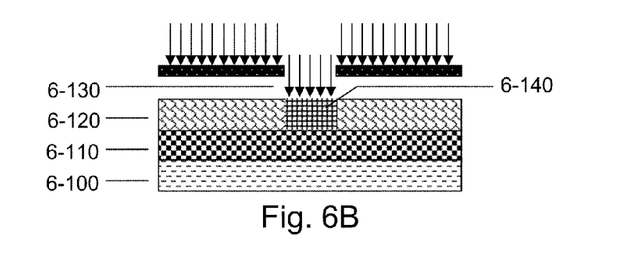

Referring now to FIG. 6B, the device 6-99 is exposed to a projected image 6-130 using a first predetermined pattern of light. In an embodiment where the first photoresist is a 193 nm resist, the first exposure wavelength is 193 nm radiation. The first exposure removal dose is equal or higher than the dose-to-clear for the first photoresist layer, and creates a first exposed region 6-140. At this stage, post-exposure bake and development of the first photoresist layer 6-120 is postponed until a later step.

Figure 6C:
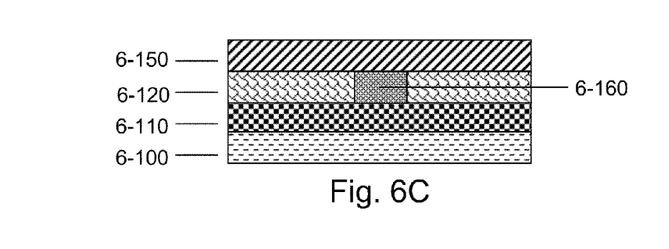

Referring now to FIG. 6C, a second photoresist layer 6-150 having a second dose-to-clear value is provided on top of the exposed first photoresist layer 6-120. The second dose-to-clear value of the second photoresist layer 6-150 is smaller than the first dose-to-clear value of the first photoresist layer 6-120. The process of forming a photoresist layer by spin coating typically includes a post-apply bake (PAB) step. A PAB step applied to the second photoresist layer 6-150 can serve as a PEB step for the first exposed region 6-140. If a PAB step applied to the second photoresist layer 6-150 is conducted at a temperature close or identical to the PEB temperature of the first photoresist layer 6-120, then a first developable region 6-160 is defined within the first photoresist layer 6-120 as a result of such bake step.

Figure 6D:
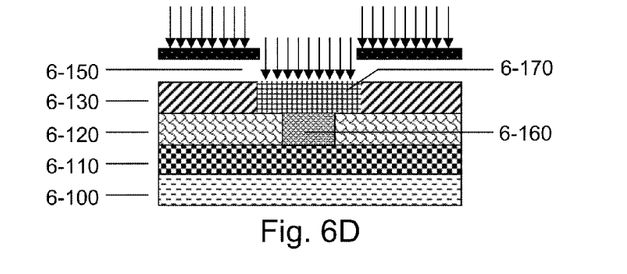

Referring to FIG. 6D, the device 6-99 is exposed to a projected image 6-150 using a second predetermined pattern of light. In an embodiment where the second photoresist is a 193 nm resist, the second exposure wavelength is 193 nm radiation. The second exposure removal dose is at or above the dose-to-clear value for the second photoresist layer, and creates a second exposed region 6-170, while the first photoresist layer 6-150 remains insensitive to the second projected image 6-150.

Figure 6E:
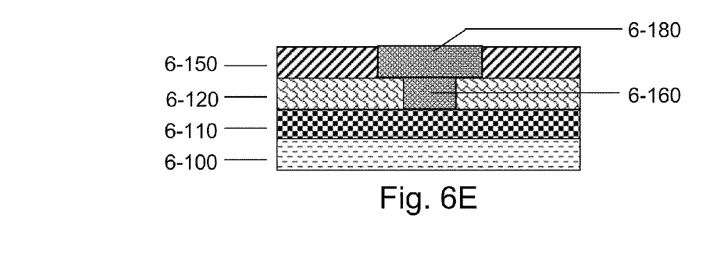

Referring now to FIG. 6E, the first and second photoresist layers 6-120 and 6-150 are post-exposure baked to define a first developable region 6-160 and a second developable region 6-180.

Figure 6F:
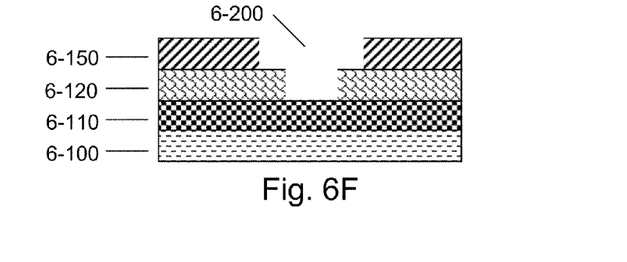

Referring now to FIG. 6F, the first and second photoresist layers 6-120 and 6-150 are developed in a conventional developer in a single step to form a dual damascene pattern 6-200 in the dual layer resist stack. A typical developer according to one embodiment of the invention is a 0.26M aqueous base developer, although other developers as are known in the art can also be utilized. The resulting pattern 6-200 can then be transferred using known methods into the underlying interlayer dielectric 6-110 or other material for other applications requiring multilevel structures (not shown). Optionally, if the photoresists 6-120, 6-150, meet the requirements of a standard dielectric, this dual damascene image would be the final structure.

The wavelength sensitivities referenced in the above embodiments are exemplary, and photoresists of other wavelength sensitivities are within the scope of an to embodiment of the invention.

Further embodiments of the invention comprise the use of 248 nm photoresists, i-line (365 nm) photoresists, g-line (412 nm) photoresists or combinations thereof. The embodiments depicted in FIGS. 6A-6F could be implemented using photoresist layers with sensitivities to different wavelengths, wherein the first photoresist layer is insensitive to the radiation wavelength associated to the second exposure.

Intermediate layers could be utilized to optimize the overall structure, and other layers could be included to improve process latitude, such as a top antireflective layer or a bottom antireflective layer. For the sake of clarity, these additional layers have not been depicted in FIGS. 6A-6F.

According to another exemplary embodiment of the invention, the photoresists comprise photoimagable interlayer dielectrics. For example, if the photoresists shown in FIGS. 6A-6F are capable of performing as an interlayer dielectric, then the topography in the resist pattern after development would be that of the dual damascene structure, within which metal can be deposited according to processes known in the art. All the benefits of a multilayer-multiexposure process according to an embodiment of the invention can be enhanced by eliminating the need for a reactive ion etch transfer of the structure into a traditional non-photoimagable interlayer dielectric.

Alternatively, if the developed resist pattern 6-200 can function as a dielectric, or if the photoresist stack does not include an ILD, the resist pattern formed by development can be transferred into a metal, such as Al, Cu, Ag, or alloys thereof, to form a structure. A dielectric can be deposited over the structure formed thereof and polished to reveal the metallic interconnect structure.

Figure 7:
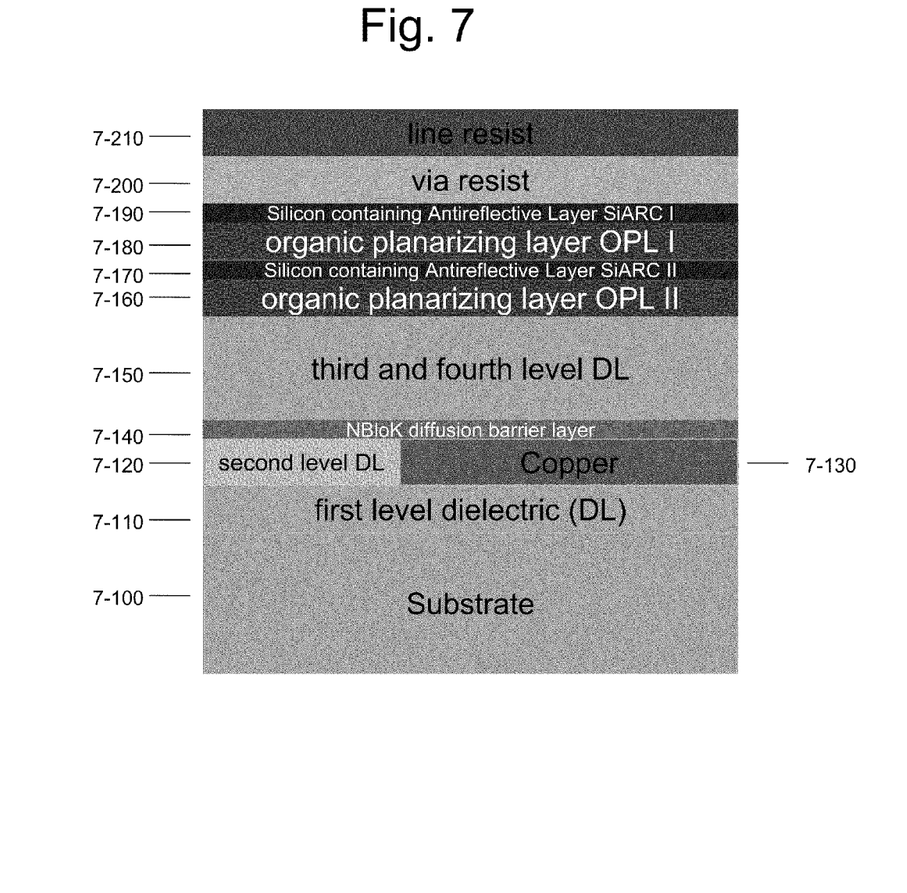
FIG. 7 is a schematic diagram that depicts a multi-layer stack incorporating all material layers necessary for implementing a dual damascene fabrication process according to an exemplary embodiment of the present invention.

Another exemplary embodiment of the invention as shown in the schematic drawing given in FIG. 7 employs an additional multilayer stack between the photoresist stack consisting of a first photoresist layer 7-210 and a second photoresist layer 7-200 on the one side and the interlayer dielectric stack comprising the dielectric layers 7-110, 7-120, 7-150 on the substrate 7-100 on the other side. The additional multilayer stack comprises a first silicon containing antireflective layer 7-190 on top of a first organic planarizing layer (OPL) 7-180 which in turn is located on top of a second silicon containing antireflective layer 7-170 on top of a second organic planarizing layer 7-160. A copper layer 7-130 represents a conductive trench. The dielectric layer 7-150 and the dielectric layer 7-120 as well as the copper layer 7-130 are separated by an etch-stop NBLoK (Nitride Barrier for Low K) diffusion barrier layer 7-140

In another exemplary embodiment of the invention the stack shown in FIG. 7 consists of the following materials: first photoresist layer 7-210 material is IBM LR-1010 resist (360 nm thick), second photoresist layer 7-200 material is JSR ARX2928 resist at (250 nm thick), first silicon containing antireflective layer 7-190 material is SiARC A940 (70 nm thick), first organic planarizing layer 7-180 material is NFC-1400 (100 nm thick), second silicon containing antireflective layer 7-170 material is SiARC A940 (70 nm thick), and the second organic planarizing layer 7-160 material is NFC (300 nm thick).

Figure 8A:
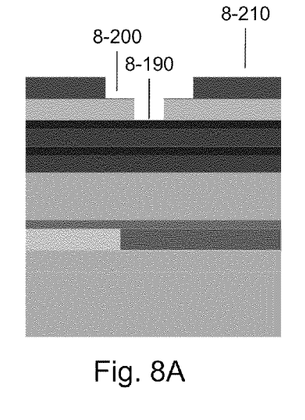
FIGS. 8A-8I are schematic diagrams that depict a dual damascene fabrication process according to an exemplary embodiment of the present invention incorporating an exemplary embodiment of a RIE-based pattern transfer process of the multi-tiered is photo-resist structures into an interlayer dielectric layer.
Figure 8B:
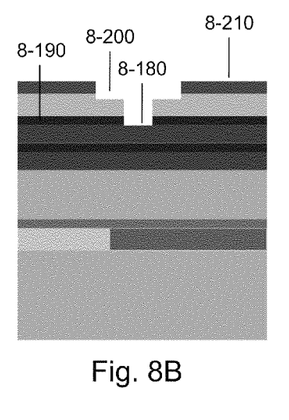
Figure 8C:
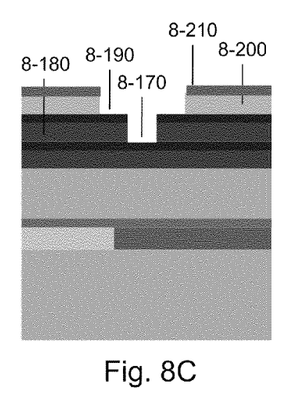
Figure 8D:
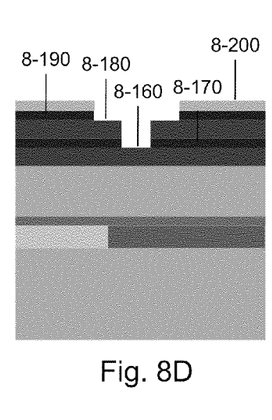
Figure 8E:
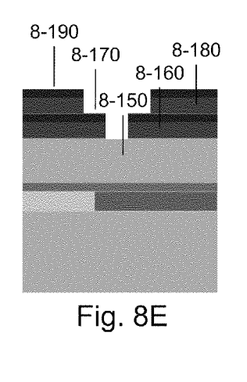
Figure 8F:
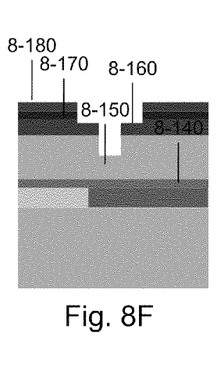
Figure 8G:
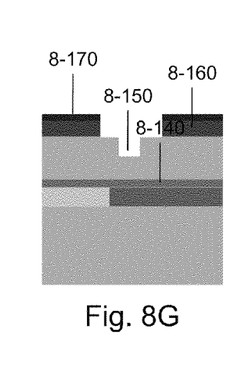
Figure 8H:
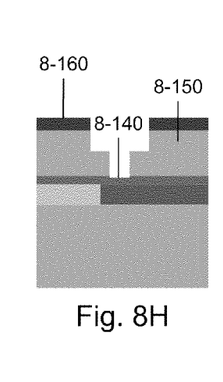
Figure 8I:
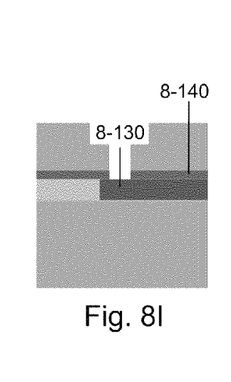

FIGS. 8A-8I are schematic diagrams that depict a reactive ion etch (RIE) pattern transfer process of a multi-tiered photoresist structure based on the above exemplary embodiments of the present invention into a dielectric layer on the substrate. FIG. 8A shows the opened patterned profile of the multi-tiered photoresist structure in the first photoresist layer 8-210 and the second photoresist layer 8-200. The surface of the first silicon containing antireflective layer 8-190 is unmasked in the open via region of the second photoresist layer 8-200. Now referring to FIG. 8B, unmasked regions of the first silicon containing antireflective layer 8-190 are etched away in an ideally anisotropic dielectric RIE step until a surface area of the first organic planarizing layer 8-180 is exposed. In this RIE step the top surface of the first photoresist layer 8-210 and the unmasked area of the second photoresist layer 8-200 will also be partly etched down, but not to completely remove the first photoresist layer 8-210. Now referring to FIG. 8C, unmasked regions of the first organic planarizing layer 8-180 are etched away in an ideally anisotropic organic RIE step until the surface area of the second silicon containing antireflective layer 8-170 is exposed. In this RIE step, the top surface of the first photoresist layer 8-210 and the unmasked area of the second photoresist layer 8-200 will also be partly etched down, to completely or partly remove the first photoresist layer 8-210 but preserving those areas of the second photoresist layer 8-200 that were masked by the first photoresist layer 8-210 before it was etched away or further down, respectively. In case the first photoresist layer 8-210 was not removed completely in this step it will be etched away in the next step as described in FIG. 8D. Now referring to FIG. 8D, all unmasked regions of both the first silicon-containing antireflective layer 8-190 as well as the second silicon containing antireflective layer 8-170 are etched away in an ideally anisotropic dielectric RIE-etch step until the surface area of the first organic planarizing layer 8-180 and the second organic planarizing layer 8-160 are exposed. In case remains of the first photoresist layer 8-210 are still present these remains are completely etched away during this RIE step before the second photoresist layer 8-200 is partly etched down and masks and therefore preserves the first silicon containing antireflective layer 8-190. In case no remains of the first photoresist layer 8-210 are present on top of the second photoresist layer 8-200 only the second photoresist layer 8-200 is partly etched down during this RIE step and masks and therefore preserves the first silicon containing antireflective layer 8-190. Now referring to FIG. 8E all unmasked areas of both the first organic planarizing layer 8-180 as well as the second organic planarizing layer 8-160 are etched away in an ideally anisotropic organic RIE step until the surface areas of the second silicon containing antireflective layer 8-170 and the dielectric layer 8-150 are unmasked. During this etch step both silicon containing antireflective layers 8-190 and 8-170 are preserved and act as hardmask for etching the corresponding organic patterning layers 8-180, and 8-160 respectively. Remains of the second photoresist layer 8-200 on top of the first silicon containing antireflective layer 8-190 are completely etched away during this RIE step. Now referring to FIG. 8F all unmasked areas of both silicon containing antireflective layers 8-170 and 8-190 as well as the dielectric layer 8-150 are etched down in an ideally anisotropic dielectric RIE step. This etch step is terminated after the first silicon containing antireflective layer 8-190 and the unmasked parts of the second silicon containing antireflective layer 8-170 are completely etched away but before the exposed parts of the first organic planarizing layer 8-180 and the second organic planarizing layer 8-160 vanish. During this etch step the exposed parts of the dielectric layer 8-150 are partly etched away, thus partly transferring the initial multi-tiered photoresist structure that was initially formed in the second photoresist layer 8-200 into the dielectric layer 8-150, but not exposing the NBLoK diffusion barrier layer 8-140 yet. Now referring to FIG. 8G all unmasked parts of the first organic planarizing layer 8-180 as well as the second organic planarizing layer 8-160 are etched away in an ideally anisotropic organic RIE-etch step. During this etch step the first organic planarizing layer 8-180 and after its complete removal the second silicon containing antireflective layer 8-170 serve as etch mask for etching the second organic planarizing layer 8-160. Now referring to FIG. 8H all unmasked surface areas of the dielectric layer 8-150 are etched down in an ideally anisotropic RIE step until the complete initial multi-tiered photoresist structure of both resist layers 8-210 and 8-200 as shown in FIG. 8A is transferred into the dielectric layer 8-150. After completion of this etch step the second silicon-containing antireflective layer 8-170 is completely etched away. The second organic planarizing layer 8-160 that was masked by the second silicon containing antireflective layer 8-170 during the first part of this etch step is thinned down but not completely removed. Both the second silicon containing antireflective layer 8-170 as well as the second organic planarizing layer 8-160 serve as etch mask for etching the dielectric layer 8-150. After completely transferring the multitiered photoresist structure of both resist layers 8-210 and 8-200 as shown in FIG. 8A into the dielectric layer 8-150 as shown in FIG. 8H, the NBLoK diffusion barrier film surface shows at the bottom of dual damascene dielectric structure. Now referring to FIG. 8I the remaining parts of the second organic planarizing layer 8-160 are completely etched away in an organic RIE step. Unmasked areas of the NBLoK diffusion barrier film layer 8-140 are etched away to expose the copper surface from layer 8-130. This is the last step before being able to conductively contact the copper layer 8-130.

In all of the above described exemplary embodiments, once the resist pattern, such as 6-200, is transferred into the dielectric 6-100 (as shown in FIG. 6), the dual damascene structure formed in the dielectric layer by the resist pattern can be lined according to known methods with a conventional liner such as Ta, Ru, W, TaN, etc., and a conductive seed layer such as Cu. The lined structure formed in the dielectric layer can be plated with Cu and polished to reveal a dual damascene interconnect structure.

Examples of applications for the processes according to the embodiments of the invention disclosed above include diffractive gratings, microfluidic arrays and optical communication structures, including but not limited to Wavelength Division Multiplexers, Wavelength Division Demultiplexers, Wavelength Routers, Wavelength Selectors, and waveguides.

Conventional state-of-the-art 193 nm photoresists are based on methyl methacrylate (MMA) platforms and include a protecting group, groups that boost the etch resistance to plasma processes and groups that enchance the solubility of said photoresists in organic solvents as well as in standard developer (tetramethylammonium hydroxide 0.26N in water), as taught in U.S. Pat. No. 7,517,634. Examples of protecting groups are methyl adamantyl MMA, hydroxyethyl adamantyl MMA, ethyl-cyclopentyl MMA, methyl-cyclopentyl MMA and ethyl-cyclooctyl MMA. Examples of groups that boost the etch resistance to plasma processes are alicyclic methacrylates such as norbornyl lactone MMA. Groups that enchance the solubility of said photoresists in organic solvents as well as in standard developer are fluorocarbinol MMA or fluorosulfonamide MMA.

A specific example of the embodiments of FIGS. 6, 7 & 8 is:

(i) Dielectric films were deposited by Plasma Enhanced Chemical Vapor Deposition (PECVD) using, for example, a mixture of diethoxy methyl silane and bicycloheptadiene in a reactor operated at a pressure of 2-10 Torr, an applied RF power of 400-1000 W (at 13.56 MHz) and a substrate temperature of 250-400 C. The deposited dielectric film is subsequently cured using ultraviolet light and a substrate temperature of 300-400 C. (ii) a first organic planarizing layer (OPL) is spun onto the dielectric stack at 1 krpm followed by a post-apply bake (220° C./60 s) yielding a 300-nm-thick first OPL (7-160 & 8-160), (iii) a first silicon containing antireflective layer (SiARC) acting as hardmask is spin-coated onto the first OPL at 1.5 krpm and post-spin baked (225° C./60 s) yielding a 70-nm-thick first SiARC layer (7-170 & 8-170), (iv) a second organic planarizing layer is spun onto the first SiARC layer at 1.5 krpm and post-apply baked (220° C./60 s) forming a 100-nm-thick second OPL layer (7-180 & 8-180), and (v) a second silicon containing antireflective layer acting as hardmask is spun onto the second OPL layer at 1.5 krpm and post-spin baked (225° C./60 s) yielding a 70-nm-thick second SiARC layer (7-190 & 8-190) (vi) a via photoresist (ARX Series, JSR) is applied and spun onto the second SiARC layer at 1.5 krpm yielding a 250-nm-thick resist layer (6-120 & 7-200), (vi) the via resist layer is baked at 120° C. for 60 sec, (vii) a trench photoresist (LR-1010, IBM) is applied and spun onto the via resist layer at 1.01 krpm yielding a 365-nm-thick resist layer (6-150 & 7-210), (viii) the trench resist layer is baked at 110° C. for 60 sec. Exposures were conducted using a conventional 193 nm-dry-lithography scanner with a 0.85 numerical aperture (NA) connected to a standard track tool. The via resist layer 6-120 is exposed with a custom-made photomask at 65 mJ/cm2 yielding an exposed via hole pattern 6-160 comprising circular vias each having a target diameter of approx. 110 nm in the resist. The trench resist layer 6-150 is exposed with a photomask at 15 mJ/cm2 yielding an exposed trench pattern 6-170 comprising rectangular line patterns each having a length of several 100 nm and a target width of approx. 115 nm, (ix) both exposed photoresist layers are baked at 110° C. for 60 sec and then developed in standard developer (tetramethylammonium hydroxide 0.26N).

The particular embodiments disclosed above are illustrative only; do not encompass all viable permutations as would be apparent to those knowledgeable in the art. The invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A dual damascene structure, comprising: a first dielectric layer having a first dose-to-clear value; a second dielectric layer having a second dose-to-clear value that is different than the first dose-to-clear value of the first dielectric layer;
   a pattern in said first dielectric layer and said second dielectric layer that is filled with an electrical conductor;
   said pattern comprises a first pattern in said first dielectric layer and a second pattern in said second dielectric layer;
   said first patter and said second pattern are selected from the group consisting of not being geometrically coincident and not having the same dimensions.

2. A dual damascene structure according to claim 1 wherein said second dose-to-clear value is lower than the said first dose-to-clear value.

3. A dual damascene structure according to claim 1 wherein there is a pattern in said first dielectric layer and said second dielectric layer that is filled with an electrical conductor.

4. A dual damascene structure according to claim 1 wherein said structure is a dual damascene structure.

5. A dual damascene structure according to claim 1 wherein said second dielectric layer is disposed adjacent to said first dielectric layer.

6. A dual damascene structure comprising: a first dielectric layer having a first dose-to-clear value; a second dielectric layer having a second dose-to-clear value that is different than the first dose-to-clear value of the first dielectric layer; and wherein the dose-to-clear ratio between the first dose-to-clear value and the second dose-to-clear value is comprised between about 2.5 to about 4.0.

7. A method of fabricating dual damascene structure comprising: providing in a structure a first dielectric layer having a first dose-to-clear value; providing in said structure a second dielectric layer having a second dose-to-clear value that is different than the first dose-to-clear value of the first dielectric layer; said second dose-to-clear value is lower than the said first dose-to-clear value;
- there is a pattern in said first dielectric layer and said second dielectric layer that is filled with an electrical conductor;
- said pattern comprises a first pattern in said first dielectric layer and a second pattern in said second dielectric layer; and
- said first patter and said second pattern are selected from the group consisting of not being geometrically coincident and not having the same dimensions.

8. A method according to claim 7 wherein there is a pattern in said first dielectric layer and said second dielectric layer that is filled with an electrical conductor.

9. A method according to claim 7 wherein said first dielectric layer is disposed in contact with said second dielectric layer.

10. A method according to claim 7 wherein said structure is a dual damascene structure.

11. A method of fabricating dual damascene structure comprising: providing in a structure a first dielectric layer having a first dose-to-clear value; providing in said structure a second dielectric layer having a second dose-to-clear value that is different than the first dose-to-clear value of the first dielectric layer, wherein the dose-to-clear ratio between the first dose-to-clear value and the second dose-to-clear value is comprised between about 2.5 to about 4.0.

* * * * *